(12) United States Patent
Jiang et al.

(10) Patent No.: US 7,213,942 B2
(45) Date of Patent: *May 8, 2007

(54) LIGHT EMITTING DIODES FOR HIGH AC VOLTAGE OPERATION AND GENERAL LIGHTING

(75) Inventors: Hongxing Jiang, Manhattan, KS (US); Jingyu Lin, Manhattan, KS (US)

(73) Assignee: AC LED Lighting, L.L.C., Manhattan, KS (US)

(*) Notice: Subject to any disclaimer, the term of this patent is extended or adjusted under 35 U.S.C. 154(b) by 144 days.

This patent is subject to a terminal disclaimer.

(21) Appl. No.: 11/120,832

(22) Filed: May 3, 2005

(65) Prior Publication Data

US 2005/0254243 A1    Nov. 17, 2005

Related U.S. Application Data

(63) Continuation-in-part of application No. 10/279,296, filed on Oct. 24, 2002, now Pat. No. 6,957,899.

(51) Int. Cl.
*F21S 13/14*    (2006.01)

(52) U.S. Cl. ............ 362/252; 362/545; 362/800; 257/88; 257/93; 313/500

(58) Field of Classification Search ............ 362/237, 362/241, 545, 252, 800; 257/88, 93; 313/500
See application file for complete search history.

(56) References Cited

U.S. PATENT DOCUMENTS 3,900,863 A * 8/1975 Kim ................ 257/95
5,278,432 A   1/1994 Ignatius et al.
5,317,170 A   5/1994 Paoli
5,563,422 A   10/1996 Nakamura et al.
5,652,434 A   7/1997 Nakamura et al.

(Continued)

FOREIGN PATENT DOCUMENTS

JP    2004006582    1/2004

OTHER PUBLICATIONS

S X Jin, J Li, J Y Lin and H X Jiang, InGaN/GaN Quantum Well Interconnected Microdisk Light Emitting Diodes; Applied Physics Letters, vol. 77, No. 20, p. 3236-3238, Nov. 13, 2000.

(Continued)

*Primary Examiner*—Sandra O'Shea
*Assistant Examiner*—Zahra I. Bennett
(74) *Attorney, Agent, or Firm*—Lathrop & Gage LC

(57) ABSTRACT

A single-chip integrated LED particularly adapted for direct use with a high voltage AC power comprises a plurality of series-connected LEDs arranged in two arrays and flip chip bonded to a transparent substrate. The opposite polarities of the arrays are connected together and then connected to the AC power source. During the positive half of the AC cycle, one array of LEDs is forward biased and energized, while the other array is reverse biased. During the negative half of the AC cycle, the other array of LEDs is forward biased and thus energized, while the first array is reverse biased and thus not energized. The arrays are alternately energized and de-energized at the frequency of the AC power source, and thus the single-chip integrated LED always appears to be energized.

71 Claims, 3 Drawing Sheets

U.S. PATENT DOCUMENTS

| | | | |
|---|---|---|---|
| 5,699,073 | A | 12/1997 | Lebby et al. |
| 5,767,581 | A | 6/1998 | Nakamura et al. |
| 5,773,130 | A | 6/1998 | So et al. |
| 5,877,558 | A | 3/1999 | Nakamura et al. |
| 5,929,466 | A | 7/1999 | Ohba et al. |
| 5,952,680 | A | 9/1999 | Strite |
| 5,955,748 | A | 9/1999 | Nakamura et al. |
| 5,966,393 | A | 10/1999 | Hide et al. |
| 6,054,724 | A | 4/2000 | Ogihara et al. |
| 6,093,965 | A | 7/2000 | Nakamura et al. |
| 6,410,940 | B1 | 6/2002 | Jiang et al. |
| 6,455,878 | B1 | 9/2002 | Bhat et al. |
| 6,461,019 | B1 | 10/2002 | Allen |
| 6,547,249 | B2 | 4/2003 | Collins et al. |
| 6,635,902 | B1 | 10/2003 | Lin et al. |
| 6,740,960 | B1 | 5/2004 | Farnworth et al. |
| 6,936,885 | B2 | 8/2005 | Harrah |
| 6,957,899 | B2 * | 10/2005 | Jiang et al. ............ 362/252 |
| 7,045,965 | B2 | 5/2006 | Li et al. |
| 2002/0006040 | A1 * | 1/2002 | Kamada et al. .......... 362/237 |
| 2002/0043943 | A1 | 4/2002 | Menzer et al. |
| 2004/0080941 | A1 | 4/2004 | Jiang et al. |
| 2004/0129946 | A1 | 7/2004 | Nagai et al. |
| 2004/0206970 | A1 | 10/2004 | Martin |
| 2005/0127816 | A1 | 6/2005 | Sumitani |
| 2005/0133816 | A1 | 6/2005 | Fan et al. |
| 2005/0185401 | A1 | 8/2005 | Jiang et al. |
| 2005/0253151 | A1 | 11/2005 | Sakai et al. |
| 2006/0044864 | A1 | 3/2006 | Lin et al. |
| 2006/0163589 | A1 | 7/2006 | Fan et al. |
| 2006/0169993 | A1 | 8/2006 | Fan et al. |
| 2006/0180818 | A1 | 8/2006 | Nagai et al. |
| 2006/0208264 | A1 | 9/2006 | Ryu et al. |
| 2006/0256826 | A1 * | 11/2006 | Lin et al. ............ 372/43.01 |

OTHER PUBLICATIONS

Mair et al., Optical properties of GaN/AiGaN multiple quantum well microdisks, Nov. 17, 1997, Appl. Phys, Lett. 76 (5) p. 631, American Institute of Physics.

Jiang and Lin; Advances In III-Nitride Micro-size light Emitters; Advanced Semiconductor Magazine; vol. 14, No. 5.

Chen, Chang, Chen, Fann, Jiang, and Lin; Mechanism of Photoluminescence in GaN/Al (0.2)Ga(0.8)N Superlattices; Applied Physics Letters, vol. 79, No. 23; Dec. 3, 2001.

Jiang and Lin; On Display; OE Magazine Jul. 2001.

Dr. Jing Li; III-Nitride Integrated Photonic Devices, undated.

Kansas Researchers Fabricate Blue Micro Light-Emitting Diodes, Paving Way for Microdisplays, Energy Saving Lighting;Ascribe The Public Interest Newswire, Sep. 27, 2001.

C. W Jeon, H.W. Choi and M.D. Dawson; A Novel Fabrication Method for A 64 x 64 Matrix-Addressable GaN-Based Micro-LED Array; Phys. Stat. Sol. (a) No. 1, pp. 78-82, 2003.

Zhaoyang Fan, Hongxing Jiang, Jingyu Lin; Related and Copending U.S. Appl. No. 11/144,982, filed Jun. 3, 2005.

Zhaoyang Fan; Related and Copending U.S. Appl. No. 11/340,296, Filed Jan. 26, 2006.

* cited by examiner

LIGHT EMITTING DIODES FOR HIGH AC VOLTAGE OPERATION AND GENERAL LIGHTING

CROSS-REFERENCE TO RELATED APPLICATIONS

The present application is a continuation-in-part application of Ser. No. 10/279,296, filed Oct. 24, 2002 now U.S. Pat. No. 6,957,899, which is hereby incorporated into the present application by reference.

BACKGROUND OF THE INVENTION

The present invention relates to single-chip light emitting diodes (LED), and more particularly to single-chip LEDs which can operate under standard alternating-current (AC) high voltage (110 V, 220 V, etc.) conditions for various applications, including general lighting.

LEDs are used in displays, as indicator lights, for traffic lights, for communications, and for optical interconnects. With the realization of high brightness blue/green and violet LEDs made from the III-nitride semiconductor family InN, GaN, AlN and their alloys recently it is now possible that LEDs may be used for general lighting applications in residential houses and commercial buildings. LEDs have already found niche applications in the area of lighting, such as passenger side reading lights in vehicles. Because of the potential energy, environment and national security benefits, there is increasing national interest in creating a partnership—of industry, universities and national laboratories— aimed at accelerating the development of Solid-State Lighting science and technology. A nation-wide program called "Next-Generation Lighting Initiative" has been lunched by the Department of Energy (DOE).

Several methods have been proposed and employed to achieve white light emission from LEDs. The first and the only commercial product is to use blue LEDs made of III-nitrides to generate white light by coating the blue LED chips with yellow phosphors. Phosphors down convert part of the shorter wavelength blue light to a yellow wavelength visible yellow light. Through color mixing, the eye sees white when two colors are properly balanced. Other proposed method includes using UV LEDs (more efficient sources) to pump three-color phosphors (red, blue, green, RBG) or to combine three color (RBG) LEDs to get white emission.

Currently, all semiconductor LEDs are DC operated with typical operating voltages of a few volts (e.g., around 2 volts for Red LEDs and around 3.5 volts for blue LEDs). However, substantially all the houses and buildings in North America are wired with AC (60 Hz) 110 volts power sources. One way to use LEDs for general lighting applications is to convert AC 110 V to DC with a low voltage. This requires the use of power converters, which may be installed separately or built into the LED package. This approach has been utilized in LED traffic signal lights. Use of power converters have disadvantages such as added volume, added costs, and low efficiency, for example.

There is also a method for achieving AC operation of LEDs by wiring two discrete LEDs connected opposite of one another (the cathode of one goes to the anode of the other). When the LEDs are connected to a low voltage AC circuit, both LEDs glow alternately; one LED is biased by positive voltage side of the AC cycle (forward biased), and the other LED is biased by the negative voltage side of the AC cycle (reverse biased). Since the AC source usually runs at 60 Hz both LEDs appear to be always on to the naked eye. However, there are no new technologies involved in this type of "AC-LEDs" by ganging together a strand of LEDs and they are not suitable for lighting applications. To achieve high voltage AC operations, one needs to connect a few dozens of LEDs in a similar fashion. Hence it would not be viable economically or physically to replace an incandescent lamp by a strand of discrete of LEDs.

A need remains in the art for single-chip LEDs for standard high AC voltage (110 volts or 220 volts) operations. A need also remains in the art for integrated semiconductors optical components on a single chip; in this case it involves the integration of many LEDs.

SUMMARY OF THE INVENTION

The present invention provides a single-chip LED device through the use of integrated circuit technology, which can be used for standard high AC voltage (110 volts for North America, and 220 volts for Europe, Asia, etc.) operation. The single-chip AC LED device integrates many smaller LEDs, which are connected in series. The integration is done during the LED fabrication process and the final product is a single-chip device that can be plugged directly into house or building power outlets or directly screwed into incandescent lamp sockets that are powered by standard AC voltages.

The series connected smaller LEDs are patterned by photolithography, etching (such as plasma dry etching), and metallization on a single chip. The electrical insulation between small LEDs within a single-chip is achieved by etching light emitting materials into the insulating substrate so that no light emitting material is present between small LEDs. The voltage crossing each one of the small LEDs is about the same as that in a conventional DC operating LED fabricated from the same type of material (e.g., about 3.5 volts for blue LEDs).

The single-chip AC LED device is formed by depositing layers of n-type semiconductor material, optically active layers and p-type semiconductor material in succession on an insulating transparent substrate. The chip is then flipped to be bonded to a submount and light is extracted from the top transparent substrate side. By flip-chip bonding, the AC LED device has more light extraction from the transparent substrate side without any light blocking by the contacts and interconnection metals. Flip-chip bonding the AC-LED on a highly thermal-conductive submount will also enhance the heat transferred away from the LED active region to the submount and then dissipated in the environment.

To account for the difference between the AC and DC current, two columns of series-connected mini-LEDs are wired in opposite polarities. At one instant, all the mini-LEDs in one of the columns are forward biased and hence are all turned-on, while the mini-LEDs in the other column are all reverse biased and hence are all turned off. However, the AC current turns on and off these two columns alternately. Since the frequency of AC power supply is 60 Hz (or 50 Hz) all these small LEDs within the single-chip appear to be on all the time to the naked eye.

DETAILED DESCRIPTION

Figures 1, 2:
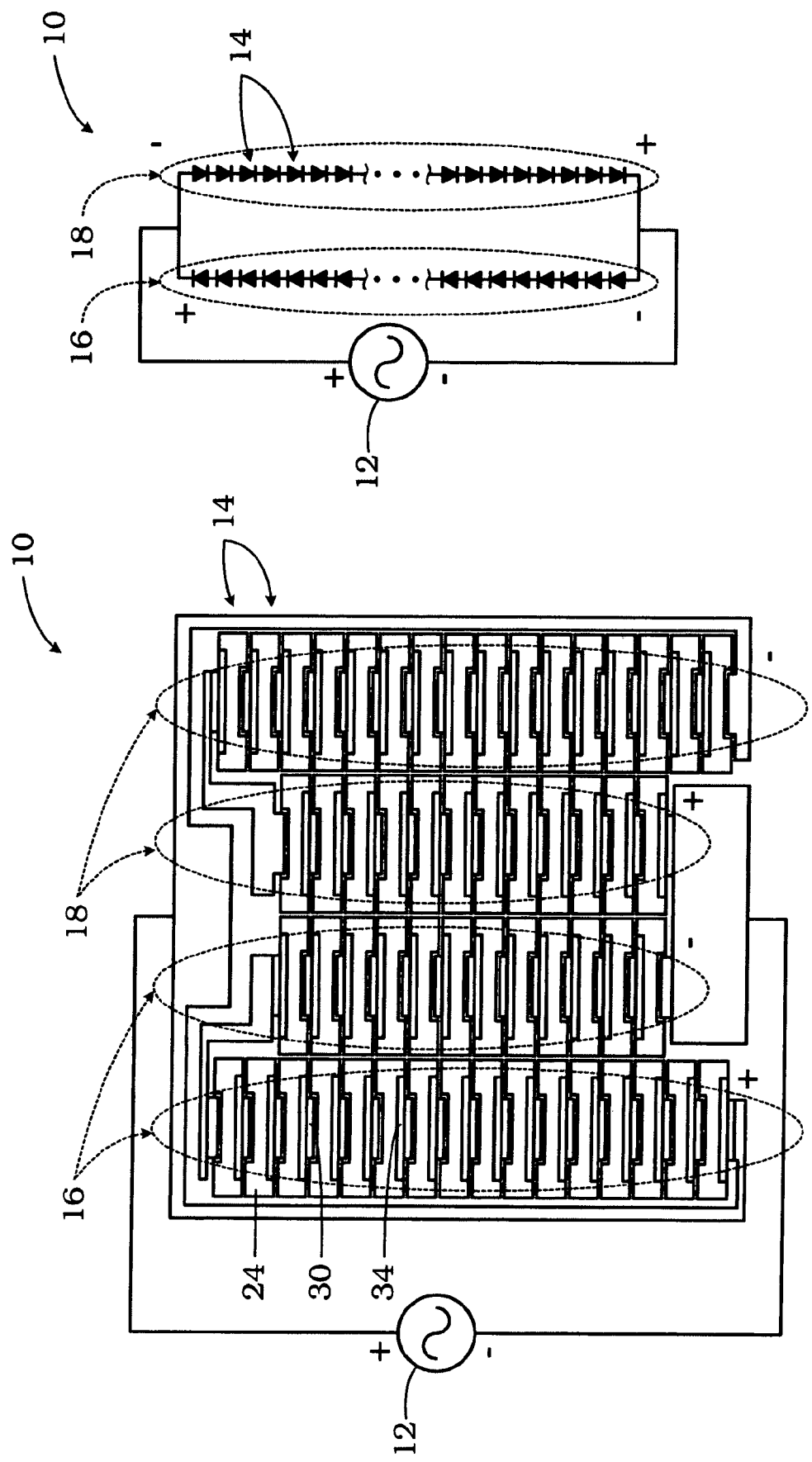
FIG. 1 is a diagrammatic plan view of a single-chip high voltage AC LED device of the present invention.
FIG. 2 is an equivalent circuit of the single-chip high voltage AC LED device of FIG. 1.

Referring to FIG. 1, a single-chip high voltage AC LED device 10 is illustrated connected to a high voltage AC power supply 12. As shown, the single-chip high voltage AC LED device 10 effectively consists of two arrays of series-connected individual smaller LEDs 14. The two arrays of series-connected individual LEDs are then connected to the opposite polarities of the high voltage AC power source 12. Each LED array could be made into one or many columns to fit the desired geometrical shape of the single-chip high voltage LED. In FIG. 1, each array consists of two columns for illustration.

Referring to FIGS. 1 and 2, the first array 16 of the single-chip AC LED device 10 provides a number of series-connected smaller LEDs 14. The cathode of one LED 14 is connected to the anode of the next LED to form the array 16. The array 16 of LEDs 14 presents a positive terminal corresponding to the cathode of the last LED (shown at the bottom of the first column of array 16 in FIG. 1 and shown at the top of array 16 in FIG. 2), and a negative terminal corresponding to the anode of the first LED (shown at the bottom of the second column of array 16 in FIG. 1 and shown at the bottom of the array 16 in FIG. 2). The second array 18 of the single-chip AC LED device 10 provides an equal number of series-connected smaller LEDs 14. The cathode of one LED 14 is connected to the anode of the next LED to form the array 18. The array 18 of LEDs 14 also presents positive and negative terminals, which are connected to the opposite terminal of array 16. When the AC cycle is positive, the LEDs 14 of array 16 are forward biased and thus energized. At the same time, the LEDs 14 of array 18 are reverse biased, and hence turned off. When the AC cycle is negative, the LEDs 14 of array 16 are reverse biased and hence turned off, while the LEDs 14 of array 18 are forward biased and thus turned on.

The arrays 16 and 18 are connected to different polarities of the AC power source for high voltage AC operation. The arrays 16 and 18 of smaller LEDs 14 are alternatively turned on and off at a rate corresponding to the frequency of the AC source. Common frequencies for public utilities are 60 Hz or 50 Hz, for example. Thus for a 60 Hz AC power source, arrays 16 and 18 are alternatively energized at a 60 Hz rate. In this manner, to the naked eye, the single-chip high voltage AC LED device 10 always appears to be on.

The number of series-connected smaller LEDs 14 in each array 16 and 18 depends on the operating voltage of the individual LEDs 14. The operating voltage of an LED depends on the type of the LED, which is around 2 volts for red LED and around 3.5 volts for blue LEDs. The typical variation in the operating voltage among individual smaller LEDs may be approximately 0.1–0.3 V depending on the type and manufacturer of the LED. For example, using LEDs having a typical operating voltage of 4.0 volts, the number of the LEDs "n" in each array 16 and 18 is approximately 28 for a 110 volt AC power source 12.

For a 220 volt AC application, as is commonly used in European and Asian countries, for example, approximately 55 LEDs would be integrated into each array. Thus, the number of LEDs is dependent on the voltage characteristics of the LEDs used or formed on the single-chip, and the application voltage of 110 volts AC or 220 volts AC. For a forward voltage of 3.5 volts for an individual LED 14, for example, the number of LEDs "n" in each column 16 and 18 is approximately 31 for a 110 volt AC power source. The number of LEDs is dependent on the voltage characteristics of the type of LED used. For example, the forward voltage for a red LED may be approximately 2 volts and 3 to 4 volts for a blue LED. If the AC voltage is 220 volts, the number of LEDs in the columns 16 and 18 will be approximately double that of the 110 volt application.

Figure 3:
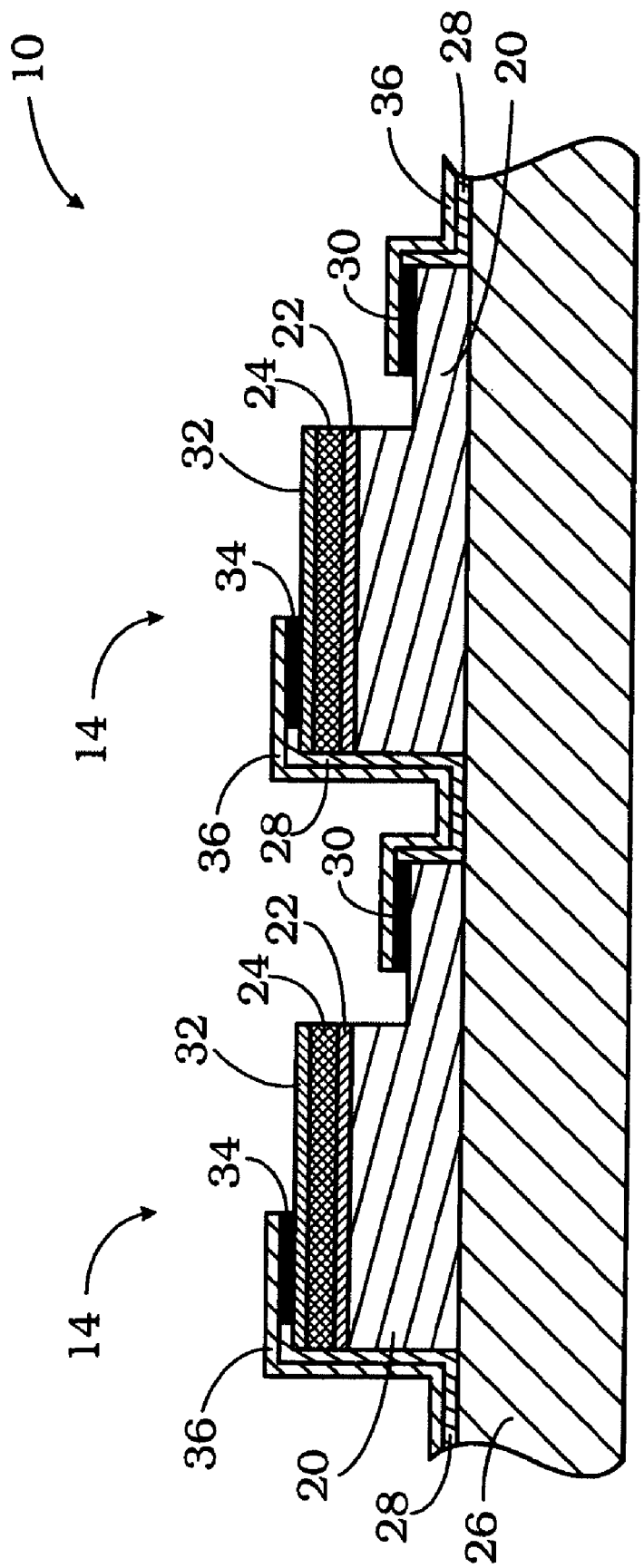
FIG. 3 is a diagrammatic cross sectional illustration showing integration between adjacent LED elements within the single-chip high voltage AC LED device using standard mounting.

Referring to FIG. 3, a diagrammatic cross-sectional view of the single-chip AC high voltage LED device 10 is illustrated showing the details of integration and connection of two adjacent smaller LEDs 14. The single-chip AC LED device 10 is formed by depositing layers of n-type semiconductor material 20, optically active layers 22 and p-type semiconductor material 24 in succession on an insulating substrate 26. In FIG. 3, n-type gallium nitride (n-GaN) 20, indium gallium nitride/gallium nitride multiple quantum wells (InGaN/GaN MQW) optically active layers 22 and p-type gallium nitride (p-GaN) 24 in succession on a sapphire substrate 26 are being used as an illustration. Substrate 26 may be made of an insulating material as shown in FIG. 3 or may be a layer of insulating film deposited on a conducting substrate or other material.

The electrical insulation between the two adjacent LEDs 14 is accomplished by etching into the insulating substrate 26 so that a trench is formed and no light emitting material is present between the two LEDs 14. An insulating film 28 such as silicon dioxide, silicon nitride, or other oxides, nitrides or polymides materials, for example, is subsequently deposited on the etched surface 26. An n-type ohmic contact (cathode) 30 is deposited on the exposed n-type layer 20. A transparent p-type metal film 32 is deposited on the p-type layer 24 upon which a p-type ohmic contact (anode) 34 is deposited. A conductive metal wire 36 connects the n-type ohmic contact 30 of one LED 14 to the p-type ohmic contact 34 of the next LED 14. If the trench sidewalls are very steep, the deposition of the insulating film 28 and the interconnecting metal wires 36 may not be conformal on the steep sidewalls, which may degrade the device performance, yield and reliability. Using isotropic etching, the trench sidewalls are sloped. As a result, the insulating film 28 and metal wire 36 may be deposited with a conformal profile.

The anode and cathode are formed by depositing different metals and then thermally annealing in different temperatures and ambient environments. To simplify the processing steps, a tunneling junction consisting of heavily doped $n^+$ semiconductor and $p^+$ semiconductor layers grown on the p-type semiconductor layer 24 may also be used. In this case, both the anode and cathode are formed in the same process step by the same metals on the $n^+$ and n semiconductors respectively.

It should be understood that p-n junction, heterojunction, multiple quantum well, organic electro-luminescent and polymer electro-luminescent LEDs as well as other types light emitting diodes may be configured as described hereinabove or in other combinations. Additionally, LEDs may be configured for 110 volt operation and 220-volt operation using switches. When configured for 110-volt operation, the arrays 16 and 18 may be connected as described hereinabove. Using a pair of switches, the 110-volt configuration may be converted to 220-volt operation wherein both arrays are series-connected and forward biased simultaneously. In this way, all of the LEDs are energized or on for half of the AC cycle and all of them are off for the other half of the AC cycle.

Figure 4:
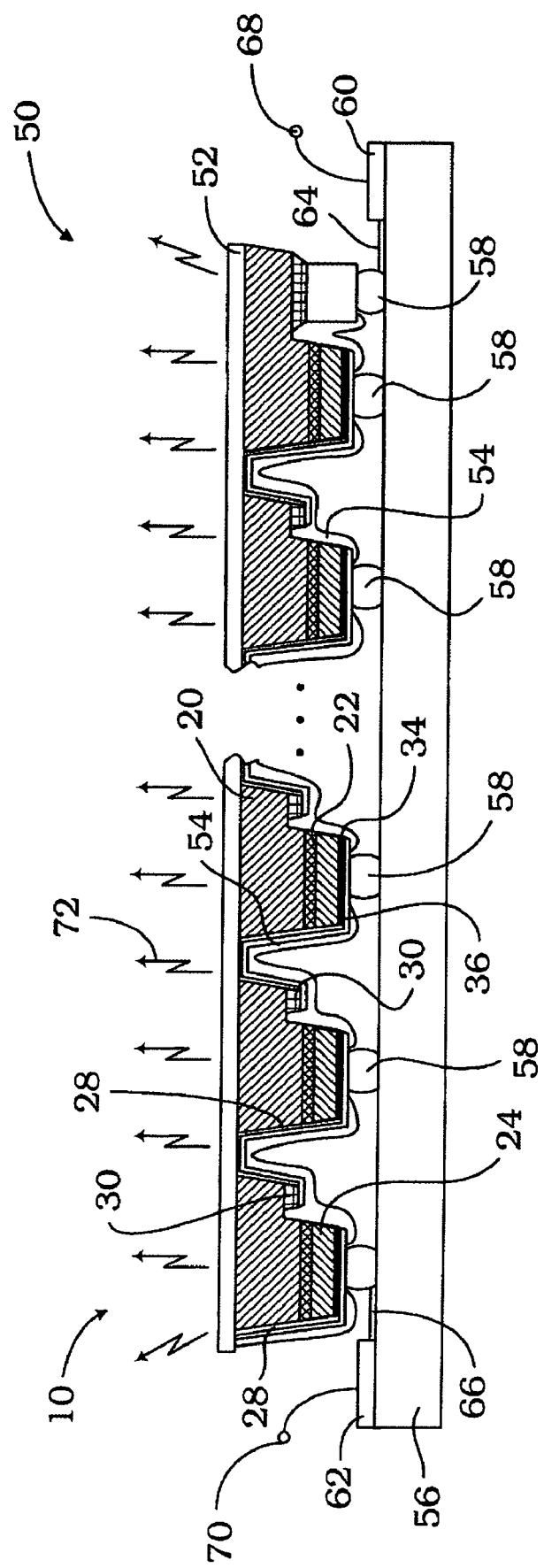
FIG. 4 is a diagrammatic cross sectional illustration showing the single-chip high voltage AC LED device mounted using a flip-chip bonding method.

Referring to FIG. 4, an alternate mounting method using a flip-chip bonding technique for the single-chip AC LED device 10 is generally indicated by reference numeral 50. By flip-chip bonding, the AC-LED device has more light extraction from the transparent substrate side without any light blocking by the contacts and interconnection metals. Flip-chip bonding the AC-LED on a highly thermal-conductive submount will also enhance the heat transferred away from the LED active region to the submount and then dissipated in the environment. The single-chip AC LED device 10 is formed by depositing layers of n-type semiconductor material 20, optically active layers 22 and p-type semiconductor material 24 in succession on an insulating transparent substrate 52. An n-type gallium nitride (n-GaN) 20, indium gallium nitride/gallium nitride multiple quantum wells (InGaN/GaN MQW), optically active layers 22 and p-type gallium nitride (p-GaN) 24 in succession on the transparent substrate 52 are being used as an illustration.

The electrical insulation between two adjacent LEDs 14 is accomplished by etching (dry or wet chemical etching) into the transparent substrate 52 so that no light emitting material is present between adjacent LEDs 14. An insulating film 28 such as silicone dioxide ($SiO_2$) is subsequently deposited on the etched surface. An n-type ohmic contact 30 is deposited on the exposed n-type layer 20. A p-type ohmic contact 34 is deposited on the p-type layer 24. A conductive layer 36 connects the n-type ohmic contact 30 of one LED 14 to the p-type ohmic contact 34 of the adjacent LED 14. A passivation layer 54 forms over all of the LEDs 14. The passivation layer 54 is removed from the conductive layer 36 and the chip 10 is flipped to be bonded to submount 56, and light is extracted from the top transparent substrate side. The p-contact 34 may be the commonly used Ni/Au metal stack; on the other hand, to enhance the light extraction from the top substrate 52 side, the p-contact 34 may incorporate a highly reflective metal layer to reflect the light emitting toward the bottom submount 56 back to the substrate 52 side. For example, thin and transparent Ni/Au metal layer less than 10 nm may be first deposited and annealed at high temperature to form ohmic contact to p-GaN 24, and then a thick (>100 nm) silver or other highly reflection metal may be deposited on the Ni/Au to form a highly reflective mirror.

Submount 56 includes bonding bumps 58 which are in spaced alignment with the LEDs 14. Bonding bumps 58 may be made of different solders such as PbSn and AuSn alloy, or other conductive material such as Au, In and Cu. Conductive terminal pads 60 and 62 are mounted at opposite ends of the submount 56 with a metal film or leads 64 and 66 to the adjacent bonding bumps 58. Terminal connections 68 and 70 are fixed to each terminal pad 60 and 62 respectively. The entire flip chip assembly 50 is heated until the bonding bumps 58 begin to melt and then cooled to bond the chip 10 to the submount 56. The bonding bumps 58 serve to bond the chip 10 to the submount 56, the outside bonding bumps 58 also provide an electrical connection to the chip 10, and the bonding bumps 58 provide a thermal conduction path from the chip 10 to the thermal-conductive submount 56 to dissipate heat more quickly. Light 72 is extracted from the transparent substrate 52. Furthermore, if underfill is incorporated to fill the space between the LED and submount, the underfill should have a small value of refractive index, so that the light extraction downward to the submount 56 is minimized.

The emitted light color from the AC-LED will depend on the bandgap energy of the semiconductor materials. By varying the semiconductor alloy composition or using different semiconductor materials, the AC-LED can emit different colors covering infrared, visible and ultra-violet (UV) light. For example, if InGaN alloy is used as the LED active layer, varying In composition in InGaN alloy, a light spectrum from UV, purple, blue and green can be covered. If a layer of suitable phosphors is incorporated to cover the AC-LED, i.e, the device side as illustrated in FIG. 3, or the substrate side as illustrated in FIG. 4, an AC-LED with white color can be formed. The selection of phosphors depends on the intrinsic color of LED itself. If AC-LED has an intrinsic color of blue, then yellow phosphor can be used. The blue light from the LED will activate the phosphor to emit yellow light. The combination of the transmitted blue light with the yellow light from phosphor gives a white light. Other phosphors with different emission wavelength can also be used. Besides, several AC-LED devices with different color emission, red, green and blue, can be packaged in a same packaging house, and the color mixture will be white emission.

It should be understood that while a certain form of this invention has been illustrated and described, it is not limited thereto except insofar as such limitations are included in the following claims.

Having thus described the invention, what is claimed as new and desired to be secured by Letters Patent is:

1. A single-chip integrated LED device for use with an AC power source comprising:
   a first plurality of series connected LEDs having a forward biased direction of current flow, a reverse biased direction of no current flow opposite said forward biased direction of current flow, and presenting positive and negative terminals,
   a second plurality of series connected LEDs having a forward biased direction of current flow, a reverse biased direction of no current flow opposite said forward biased direction of current flow, and presenting positive and negative terminals,
   said positive terminal of said first plurality of LEDs connected to said negative terminal of said second plurality of LEDs,
   said negative terminal of said first plurality of LEDs connected to said positive terminal of said second plurality of LEDs,
   said terminals of said first and second plurality of LEDs adapted to be connected across said AC power source, and
   wherein said first plurality of series connected LEDs and said second plurality of series connected LEDs are flip-chip bonded to a submount,
   whereby a current from said AC power source energizes said first plurality of LEDs in the forward biased direction during a first half cycle of the AC power source and said current from said AC power source energizes said second plurality of LEDs in the forward biased direction during a second half cycle of the AC power source.

2. The single-chip integrated LED as set forth in claim 1 wherein said AC power source is 110 volts.

3. The single-chip integrated LED as set forth in claim 1 wherein said AC power source is 220 volts.

4. The single-chip integrated LED as set forth in claim 1 wherein said chip is fabricated on a transparent substrate material.

5. The single-chip integrated LED as set forth in claim 1 wherein said plurality of LEDs include LEDs selected from the group consisting of semiconductor p-n junctions, semiconductor heterojunctions, semiconductor quantum wells, organic electro-luminescent materials and polymer electro-luminescent materials.

6. The single-chip integrated LED as set forth in claim 1 wherein each of said LEDs include sidewalls, said sidewalls coated with an insulation material.

7. The single-chip integrated LED as set forth in claim 6 wherein said insulation material includes an insulation material selected from the group consisting of silicon dioxide, silicon oxide, silicon nitride, other oxides, nitrides, or polymides.

8. The single-chip integrated LED as set forth in claim 6 wherein a metal wire is deposited on said insulation material to serially connect said LEDs.

9. The single-chip integrated LED as set forth in claim 8 wherein said sidewalls are sloped to enhance the light extraction and conformal deposition of said insulation material and said metal wire.

10. The single-chip integrated LED as set forth in claim 1 further comprising a highly reflective mirror layer between said series connected LEDs and said submount.

11. The single-chip integrated LED as set forth in claim 1 wherein said LEDs emit a color in the range from UV to infrared.

12. The single-chip integrated LED as set forth in claim 1 further comprising a phosphor layer on said substrate.

13. The single-chip integrated LED as set forth in claim 1 wherein said LEDs emit different wavelengths.

14. The single-chip integrated LED as set forth in claim 1 wherein said LEDs emit white light.

15. A light source comprising:
a single-chip integrated LED device having a first plurality of series connected LEDs having a forward biased direction of current flow, and a second plurality of series connected LEDs having a forward biased direction of current flow,
said first and second pluralities of LEDs connected together such that said respective forward biased directions of current flow are opposing,
structure for connecting said first and second pluralities of LEDs across an AC power source, and
wherein said first plurality of series connected LEDs and said second plurality of series connected LEDs are flip-chip bonded to a submount,
whereby said first and second pluralities of LEDs are alternatively energized by said AC power source.

16. The light source as set forth in claim 15 wherein said AC power source is 110 volts.

17. The light source as set forth in claim 15 wherein said AC power source is 220 volts.

18. The light source as set forth in claim 15 wherein said device is fabricated on a transparent substrate material.

19. The light source as set forth in claim 15 wherein said plurality of LEDs include LEDs selected from the group consisting of semiconductor p-n junctions, semiconductor heterojunctions, semiconductor quantum wells, organic electro-luminescent materials and polymer electro-luminescent materials.

20. The light source as set forth in claim 15 wherein each of said LEDs include sidewalls, said sidewalls coated with an insulation material.

21. The light source as set forth in claim 20 wherein said insulation material includes an insulation material selected from the group consisting of silicon dioxide, silicon oxide, silicon nitride and polymides.

22. The light source as set forth in claim 20 wherein a metal wire is deposited on said insulation material to serially connect said LEDs.

23. The light source as set forth in claim 22 wherein said sidewalls are sloped to enhance the light extraction and conformal deposition of said insulation material and said metal wire.

24. The light source as set forth in claim 15 further comprising a highly reflective mirror layer between said series connected LEDs and said submount.

25. The light source as set forth in claim 15 wherein said LEDs emit a color in the range from UV to infrared.

26. The light source as set forth in claim 15 further comprising a phosphor layer on said substrate.

27. The light source as set forth in claim 15 wherein said LEDs emit different wavelengths.

28. The light source as set forth in claim 15 wherein said LEDs emit white light.

29. A light source comprising:
a single-chip integrated LED device having an array of series-connected LEDs having a forward biased direction of current flow and presenting positive and negative terminals,
said terminals of said single-chip integrated LED device adapted to be connected across an AC power source, and
wherein said array of series-connected LEDs are flip-chip bonded to a submount,
whereby a current from said AC power source energizes said array of series-connected LEDs in said forward biased direction during a first half cycle of the AC power source cycle.

30. The light source as set forth in claim 29 wherein said single-chip integrated LED device further comprises a second array of series-connected LEDs having a second forward biased direction of current flow and presenting second positive and negative terminals, said second positive terminal of said second array connected to said negative terminal of said array, said second negative terminal of said second array connected to said positive terminal of said array, and wherein said second array of series-connected LEDs are flip-chip bonded to a submount, whereby said current from said AC power source energizes said second array of series-connected LEDs in said second forward biased direction during a second half cycle of said AC power source cycle.

31. The light source as set forth in 29 wherein said AC power source is 110 volts.

32. The light source as set forth in claim 29 wherein said AC power source is 220 volts.

33. The light source as set forth in claim 29 wherein said single-chip integrated LED device is fabricated on a transparent substrate material.

34. The light source as set forth in claim 29 wherein said LEDs include LEDs selected from the group consisting of semiconductor p-n junctions, semiconductor heterojunctions, semiconductor quantum wells, organic electro-luminescent materials and polymer electro-luminescent materials.

35. The light source as set forth in claim 29 wherein each of said LEDs include sidewalls, said sidewalls coated with an insulation material.

36. The light source as set forth in claim 35 wherein said insulation material includes an insulation material selected from the group consisting of silicon dioxide, silicon oxide, silicon nitride and polymides.

37. The light source as set forth in claim 35 wherein a metal wire is deposited on said insulation material to serially connect said LEDs.

38. The light source as set forth in claim 37 wherein said sidewalls are sloped to enhance the light extraction and conformal deposition of said insulation material and said metal wire.

39. The light source as set forth in claim 29 further comprising a highly reflective mirror layer between said series connected LEDs and said submount.

40. The light source as set forth in claim 29 wherein said LEDs emit a color in the range from UV to infrared.

41. The light source as set forth in claim 29 further comprising a phosphor layer on said substrate.

42. The light source as set forth in claim 29 wherein said LEDs emit different wavelengths.

43. The light source as set forth in claim 29 wherein said LEDs emit white light.

44. A light source comprising:
a single chip integrated LED device having a first plurality of series connected LEDs for flow of current therethrough in a first direction and a second plurality of series connected LEDs for flow of current therethrough in a second direction,
wherein said first and second pluralities of series connected LEDs are flip-chip bonded to a submount, and
structure for connecting said first and second pluralities of LEDs across an AC power source for flow of current therethrough alternately in said first and second directions in response to an applied current.

45. The light source as set forth in claim 44 wherein said AC power source is 110 volts.

46. The light source as set forth in claim 44 wherein said AC power source is 220 volts.

47. The light source as set forth in claim 44 wherein said single-chip integrated LED device is fabricated on a transparent substrate material.

48. The light source as set forth in claim 44 wherein said plurality of LEDs include LEDs selected from the group consisting of semiconductor p-n junctions, semiconductor heterojunctions, semiconductor quantum wells, organic electro-luminescent materials and polymer electro-luminescent materials.

49. The light source as set forth in claim 44 wherein each of said LEDs include sidewalls, said sidewalls coated with an insulation material.

50. The light source as set forth in claim 49 wherein said insulation material includes an insulation material selected from the group consisting of silicon dioxide, silicon oxide, silicon nitride and polymides.

51. The light source as set forth in claim 49 wherein a metal wire is deposited on said insulation material to serially connect said LEDs.

52. The light source as set forth in claim 51 wherein said sidewalls are sloped to enhance the light extraction and conformal deposition of said insulation material and said metal wire.

53. The light source as set forth in claim 44 further comprising a highly reflective mirror layer between said series connected LEDs and said submount.

54. The light source as set forth in claim 44 wherein said LEDs emit a color in the range from UV to infrared.

55. The light source as set forth in claim 44 further comprising a phosphor layer on said substrate.

56. The light source as set forth in claim 44 wherein said LEDs emit different wavelengths.

57. The light source as set forth in claim 44 wherein said LEDs emit white light.

58. A light source comprising:
a single-chip integrated device having a plurality of pairs of LEDs, each of said pairs of LEDs a first LED having a first forward biased direction of current flow and a second LED having a second forward biased direction of current flow, said first LED connected to said second LED opposite said second forward biased direction of current flow, said plurality of pairs of LEDs connected in series,
structure adapted to connect said plurality of pairs of LEDs across an AC power source, and
wherein said plurality of pairs of LEDs are flip-chip bonded to a submount,
whereby a current from said AC power source energizes said plurality of first LEDs in said first forward biased direction during a first half cycle of the AC power source cycle and said plurality of second LEDs in said second forward biased direction during a second half cycle of the AC power source cycle.

59. The light source as set forth in claim 58 wherein said AC power source is 110 volts.

60. The light source as set forth in claim 58 wherein said AC power source is 220 volts.

61. The light source as set forth in claim 58 wherein said single-chip integrated device is fabricated on a transparent substrate material.

62. The light source as set forth in claim 58 wherein said LEDs include LEDs selected from the group consisting of semiconductor p-n junctions, semiconductor heterojunctions, semiconductor quantum wells, organic electro-luminescent materials and polymer electro-luminescent materials.

63. The light source as set forth in claim 58 wherein each of said LEDs include sidewalls, said sidewalls coated with an insulation material.

64. The light source as set forth in claim 63 wherein said insulation material includes an insulation material selected from the group consisting of silicon dioxide, silicon oxide, silicon nitride and polymides.

65. The light source as set forth in claim 63 wherein a metal wire is deposited on said insulation material to serially connect said LEDs.

66. The light source as set forth in claim 65 wherein said sidewalls are sloped to enhance the light extraction and conformal deposition of said insulation material and said metal wire.

67. The light source as set forth in claim 58 further comprising a highly reflective mirror layer between said series connected LEDs and said submount.

68. The light source as set forth in claim 58 wherein said LEDs emit a color in the range from UV to infrared.

69. The light source as set forth in claim 58 further comprising a phosphor layer on said substrate.

70. The light source as set forth in claim 58 wherein said LEDs emit different wavelengths.

71. The light source as set forth in claim 58 wherein said LEDs emit white light.

* * * * *